United States Patent
Lai et al.

(10) Patent No.: US 6,233,528 B1
(45) Date of Patent: May 15, 2001

(54) METHOD AND DEVICE FOR SIGNAL TESTING

(75) Inventors: Jiin Lai; Jyhfong Lin; Hsin-Chieh Lin, all of Taipei (TW)

(73) Assignee: VIA Technologies, Inc. (TW)

( * ) Notice: Subject to any disclaimer, the term of this patent is extended or adjusted under 35 U.S.C. 154(b) by 0 days.

(21) Appl. No.: 09/148,949

(22) Filed: Sep. 8, 1998

(30) Foreign Application Priority Data

Dec. 24, 1997 (TW) .................................................. 86119731

(51) Int. Cl.[7] .............................. G01R 13/00; G01R 29/26
(52) U.S. Cl. ........................... 702/69; 702/79; 324/76.59; 324/76.82
(58) Field of Search .................... 702/69, 79; 324/76.82, 324/76.55, 76.59, 76.53

(56) References Cited

U.S. PATENT DOCUMENTS

| | | | |
|---|---|---|---|
| 3,663,956 | * | 5/1972 | Purdy et al. ........................ 324/83 D |
| 4,757,452 | * | 7/1988 | Scott et al. ............................ 364/481 |
| 4,800,571 | * | 1/1989 | Konishi ................................... 375/10 |
| 5,293,520 | * | 3/1994 | Hayashi .................................. 324/96 |
| 5,663,942 | * | 9/1997 | Ishibashi et al. ....................... 369/47 |
| 5,923,706 | * | 7/1999 | Marz .................................... 375/226 |
| 6,061,778 | * | 5/2000 | Sano et al. .............................. 712/35 |

\* cited by examiner

*Primary Examiner*—Kamini Shah
*Assistant Examiner*—Demetrius Pretlow
(74) *Attorney, Agent, or Firm*—Madson & Metcalf

(57) ABSTRACT

A signal-testing device used with a tester for testing a first signal and a second signal includes a selected signal generator receiving first signal and second signal for generating a selected signal the state of which is changed when first signal and second signal are in specific states, and a signal selector for selectively outputting one of first and second signals in response to the selected signal state. The present invention also provides a signal-testing method including steps of a) generating a selected signal having a plurality of pulses in response to a first signal and a second signal, b) obtaining a plurality of time differences between times when two inter-adjacent respective pulses respectively reach a specific voltage, c) obtaining a plurality of absolute values between two inter-adjacent respective time differences, and d) obtaining a phase difference by dividing by 2 an average value of the absolute values.

22 Claims, 5 Drawing Sheets

METHOD AND DEVICE FOR SIGNAL TESTING

FIELD OF THE INVENTION

The present invention relates to a signal-testing method, and to a signal-testing device also.

BACKGROUND OF THE INVENTION

The application of the phase locked loop is quite broad. Upon FM (frequency modulation) demodulation, the phase locked loop can be used to lock the phase of the signal for improving the sound effect. It is notorious the performance of the phase locked loop depends on how the signal phase is locked about which the present invention contemplates to ascertain.

FIG. 1 shows a basic circuit for a phase locked loop (PLL) 1. On the one hand, the smaller the alignment difference between the input signal x and the output signal y is, the better the PLL performance will be. On the other hand, the smaller the jitter of the output signal y is or the stabler the output signal y is, the better the PLL performance will be.

As shown in FIGS. 2A & 2B, in the prior art, for obtaining the phase difference, a tester 2 set on a trigger mode with a trigger voltage adjusted on a specific level (normally one half of the high voltage, i.e. VDD/2) normally directly connects thereto input signal x and output signal y for obtaining time differences d1, d2, d3 . . . between times when pulses of input signal x and output signal y respectively reach said specific level, and then averages the absolute values of time differences d1, d2, d3 . . . to obtain the phase difference between input and output signals x, y.

It can be seen that input signal x and output signal y are connected to tester 2 through different paths. Ideally, two identical probes for tester 2 have the same equivalent impedance, and the contact impedances of the test clippers and the signal wires are also the same by which a good test result will be obtained, which, nevertheless, is impractical or impossible in the real world. For a signal in the megahertz or gigahertz frequency range, the included error in the tested result according to the prior art is unacceptable or is difficult to calculate.

As shown in FIG. 3, it has been the trend to use the PLL in a very large scale integration circuit (VLSI) 3. Since paths a, b of input signal x and output signal y in the chip are different and thus incurred equivalent impedances thereof will be different, the tested error will be significant if the conventional testing method is applied.

As shown in FIGS. 4A & 4B, for measuring the jitter, tester 2 with a trigger voltage set at one half of the high voltage finds that pulses of output signal y begin to rise at times t1, t2, t3 . . . After the time differences thereof d1, d2, d3 . . . are calculated, we can average them to obtain the averaged cycle Tc. The maximum of the differential values d1-Tc, d2-Tc, d3-Tc . . . between respectively averaged cycle Tc and time differences d1, d2, d3 . . . is the maximum jitter. On the contrary, the minimum of the differential values will be the minimum jitter.

It is therefore tried by the applicant to deal with the above situation encountered by the prior art and/or facilitate the test for the PLL.

SUMMARY OF THE INVENTION

It is therefore an object of the present invention to provide a signal-testing method and device for facilitating the test of the phase difference and the jitter of a signal.

It is further an object of the present invention to provide a signal-testing method and device for reducing the error in measuring the phase difference.

It is still an object of the present invention to provide a signal-testing method and device for optionally measuring the phase difference and the jitter of a signal.

It is additional an object of the present invention to provide a signal-testing method and device for providing a multi-cycle jitter basis for a designer for more appropriately laying out the circuit.

It is yet an object of the present invention to provide a signal-testing method and device for minimizing the test pin number for an integrated circuit (IC).

According to a first aspect of the present invention, a signal-testing device adapted to be electrically connected to a tester for testing a first signal having a first state and a second state and a second signal having a third state and a fourth state includes a selected signal generator receiving the first signal and the second signal for generating a selected signal having a state which is changed when the first signal is in the first state and the second signal is in the third state, and a signal selector electrically connected to the selected signal generator for selectively outputting one of the first and second signals in response to the selected signal state.

Certainly, the first and the third states can be the same, and the second and the fourth states can also be the same.

Preferably the selected signal generator includes a first logic gate for outputting a clock signal having a state which is changed when the first signal is in the first state and the second signal is in the third state, and a flip-flop electrically connected to the first logic gate for outputting the selected signal where the selected signal state is changed in response to the clock signal state.

Certainly, the first logic gate can be a NOR gate. The clock signal state can be one selected from a group consisting of a low voltage state, a high voltage state, a state changing from the low voltage state into the high voltage state, and a state changing from the high voltage state into the low voltage state.

Preferably the flip-flop changes said selected signal state when the clock signal is in the state changing from the low voltage state into the high voltage state.

Certainly, the flip-flop can be a D-type flip-flop. The said selected signal state can be one of a low voltage state and a high voltage state. The signal selector can respectively select the first and the second signals when the selected signal is respectively in the low voltage and the high voltage states. The signal selector can be a multiplexer.

The selected signal generator can further include a second logic gate electrically connected to the flip-flop and having a test mode control end having an input voltage, in which the selected signal outputted from the flip-flop is kept in a first state to enable the signal selector to selectively output the second signal for testing a jitter of the output signal when the input voltage is in a first state, and the selected signal outputted from the flip-flop changes in response to the first and the second signals to enable the signal selector to respectively selectively output the first and the second signals for obtaining a phase difference between the first and the second signals when the input voltage is in a second state.

The second logic gate can be an AND gate. The first and the second states of the input voltage can be respectively in a low voltage and a high voltage. The present signal-testing device can further include the tester.

In accordance with the present invention, a signal-testing method includes the following steps of a) generating an output signal having a plurality of pulses in response to a first signal and a second signal, b) obtaining a plurality of time differences each of which represents a time difference between a time when a first one of the pulses reaches a specific voltage and a time when a second one of the pulses most adjacent to the first one pulse reaches the specific voltage, c) obtaining a plurality of absolute values of differences each of which represents a difference between most adjacent two of the plurality of time differences, and d) obtaining a phase difference by dividing by 2 an average value of the absolute values.

Certainly, the first signal and the second signal can be square waves and respectively have a plurality of pulses.

Preferably the selected signal includes a first portion and a second portion during which the first signal pulses and the second signal pulses respectively begin to rise until the first signal pulses and the second signal pulses respectively end to fall.

Certainly, the time differences have a number of 1,000. The specific voltage can be one half of a voltage of the selected signal pulse.

According to a further aspect of the present invention, a signal-testing method includes the following steps of a) generating a signal having a plurality of pulses, b) obtaining a plurality of time differences each of which represents a time difference between a time when a first one of the pulses reaches a specific voltage and a time when a second one of the pulses most adjacent to the first one pulse reaches the specific voltage, c) obtaining an average value of the time differences, d) respectively calculating differential values between the average value and the time differences, e) respectively obtaining a plurality of extreme values among the every respective differential value and several succeeding differential values thereof, and f) obtaining an extreme among the extreme values.

Certainly, the several succeeding differential values can have a number of 2 and the extreme is an extreme jitter of the signal. The extreme values can be maximum or minimum values and the extreme can be a maximum or a minimum.

The present invention may best be understood through the following descriptions with reference to the accompanying drawings, in which:

DETAILED DESCRIPTION OF THE PREFERRED EMBODIMENTS

Figure 1:
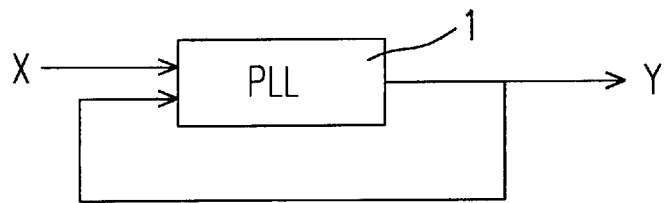
FIG. 1 is a basic circuit structure of the PLL.
Figure 2A:
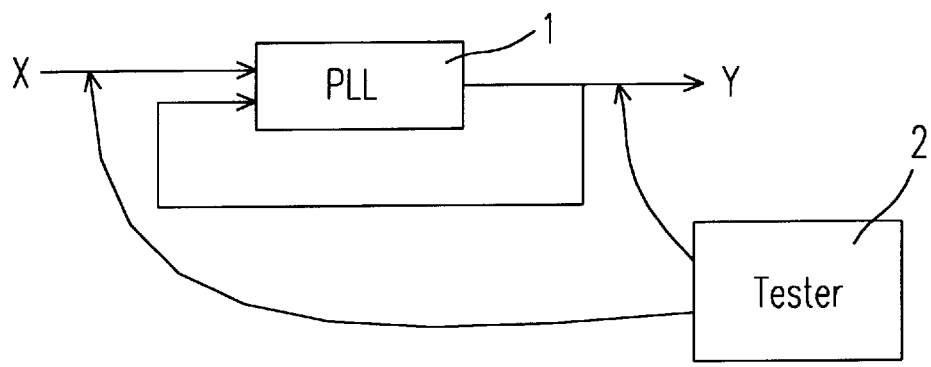
FIG. 2A is a schematical view showing how a phase difference is tested according to the prior art.
Figure 2B:
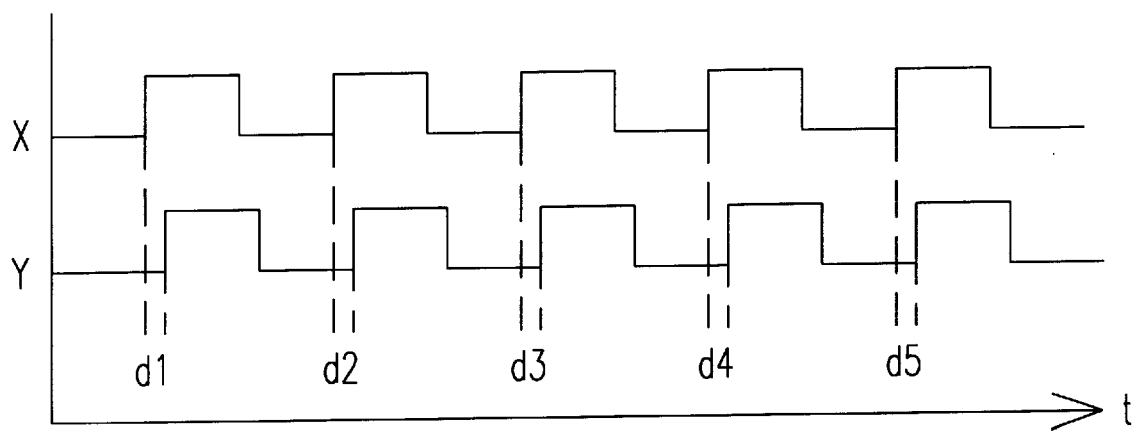
FIG. 2B is a diagram showing the time sequences for the signals in the circuit shown in FIG. 2A.
Figure 3:
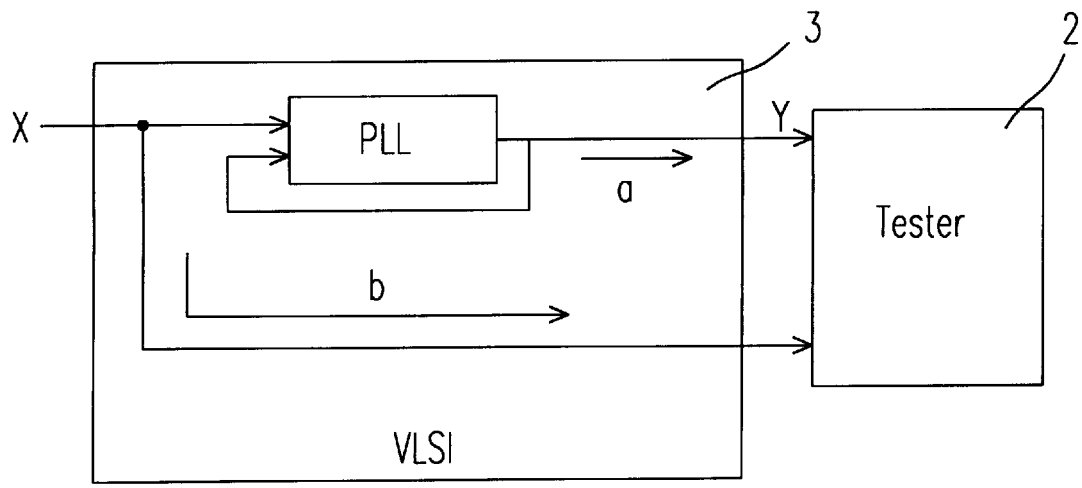
FIG. 3 is a schematical view showing how a PLL is applied in a VLSI according to the prior art.
Figure 4A:
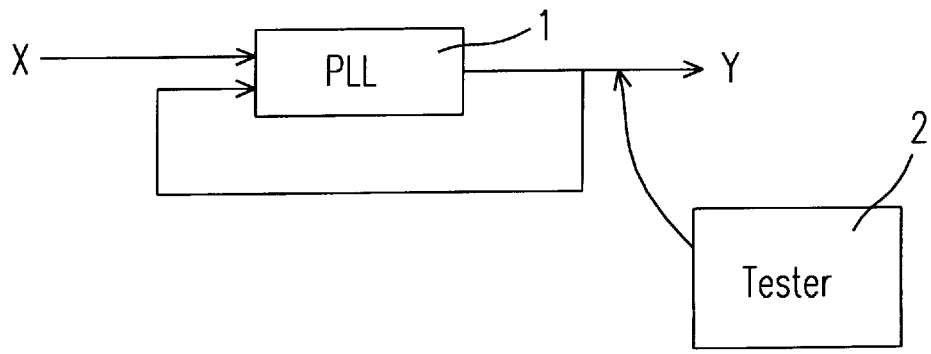
FIG. 4A is a schematical view showing how a signal jitter is tested according to the prior art.
Figure 4B:
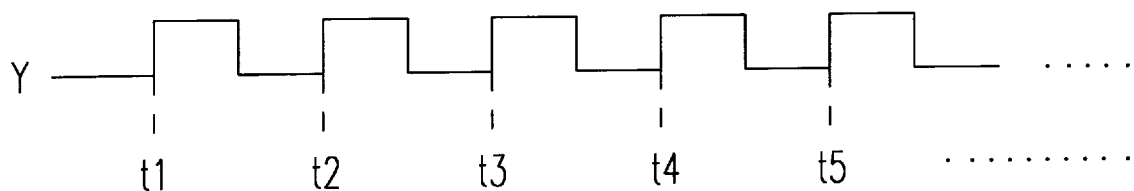
FIG. 4B is a diagram showing the time sequences for the signals in the circuit shown in FIG. 4A.
Figure 5:
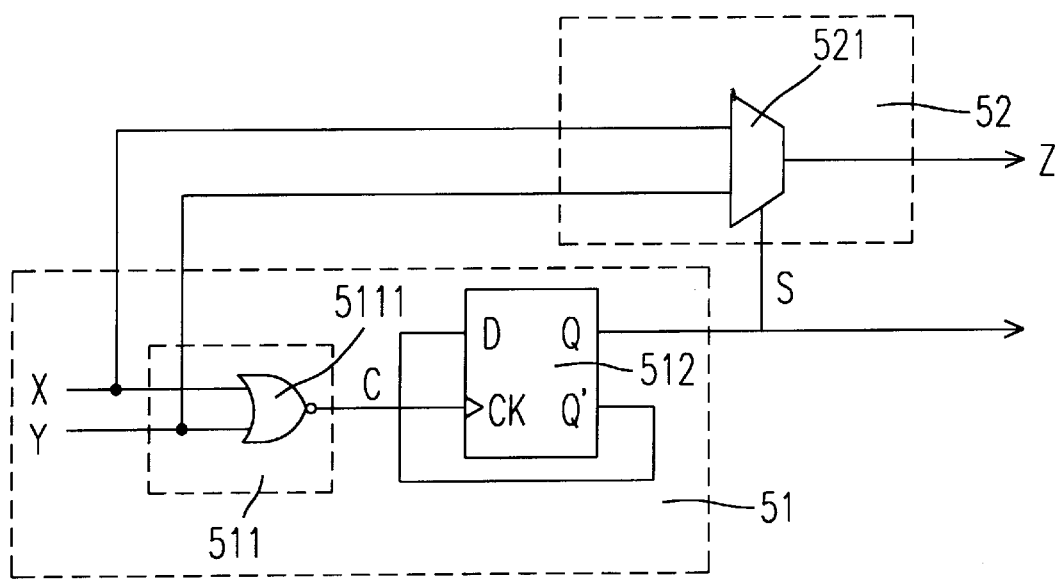
FIG. 5 is a block diagram showing a signal-testing device according to a preferred embodiment of the present invention.

Referring now to FIG. 5, there is shown a preferred embodiment of a signal-testing device according to the present invention which is to be electrically connected to a tester for testing a first signal x having a first state, e.g. "0" (low voltage) and a second state, e.g. "1" (high voltage) and a second signal y having a third state, e.g. "0" and a fourth state, e.g. "1" and includes a selected signal generator 51 receiving first signal x and second signal y for generating a selected signal S having a state which is changed when first signal x is in the first state and second signal y is in the third state, and a signal selector 52, being a multiplexer 521 in this specific instance, electrically connected to selected signal generator 51 for selectively outputting one of first and second signals x, y in response to the selected signal state.

The first and third states can both be "0", and the second and fourth states can both be "1." Selected signal generator 51 in this embodiment includes a first logic gate 511, which is a NOR gate 5111 in this particular instance, for outputting a clock signal C having a state which is changed when first signal x and second signal y are both "0", and a flip-flop, e.g. of D-type, 512 electrically connected to first logic gate 511 for outputting selected signal S where the selected signal state is changed in response to the clock signal state. The clock signal state can have 4 states, i.e. "0", "1", a state changing from "0" into "1", and a state changing from "1" into "0".

When both signals x, y are "0," clock signal C will be "1" which will trigger flip-flop 512 having thus the output Q thereof changed into the state which the input D is. Subsequently, the inverse output Q' of flip-flop 512 will inverse the digital value of the non-inverse output Q to be inputted into input D. Accordingly, once signals x, y are "0", the output of flip-flop 512 will be inversed once. Output Q in fact is selected signal S having a state changeable between a low voltage state, "0", and a high voltage state, "1" respectively in response to which multiplexer 521 will output a signal Z which is respectively selected from second signal y and first signal x. It is to be noticed that from the output Q of D type flip-flop 512, we can know what multiplexer 512 outputs is first signal x or second signal y. Certainly, the output Q can be optionally connected if desired.

Figure 6:
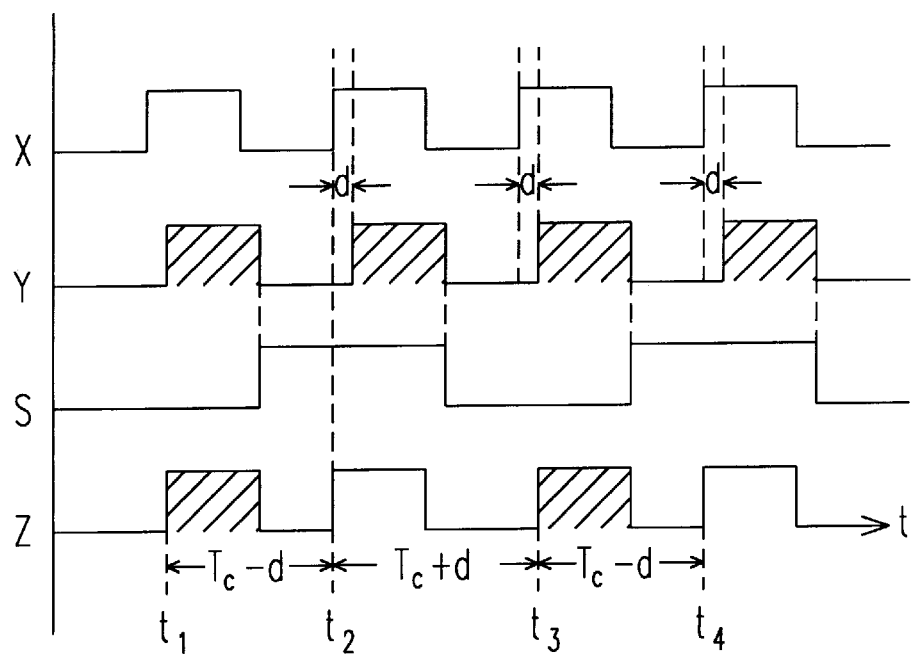
FIG. 6 is a diagram showing the time sequences for the signals in the circuit shown in FIG. 5 according to the present invention.

As shown in FIG. 6, selected signal S changes when first and second signals x, y are "0". If the initial value of selected signal S is "0", selected signal S will change from "0" into "1" when first and second signals x, y are "0". On the contrary, if the initial value of selected signal S is "1", selected signal S will change from "1" into "0" when first and second signals x, y are "0". When selected signal S is "0", we can select through multiplexer 521 signal y as output signal Z, e.g. the first pulse of output signal Z as shown. By the same token, when selected signal S is "1", we can select through multiplexer 521 signal x as output signal Z, e.g. the second pulse of output signal Z as shown.

If signals x, y have the same averaged cycle Tc, the time difference of output signal Z between t1 and t2 is Tc–d where d is the phase difference of each pulse. Similarly, we can find the time difference between t2 and t3 is Tc+d and the time difference between t3 and t4 is Tc−d. Thus, it can be known that the phase difference d can be obtained from output signal Z. The relevant procedures are as follows:

a) generating an output signal having a plurality of pulses in response to a first signal and a second signal, setting the trigger voltage of the tester to be VDD/2, and setting time points tn, in which n=1, 2, 3 . . . 1,000, where the pulses respectively reach VDD/2;

b) obtaining a plurality of time differences Dn=tn+1−tn, where n=1, 2, 3 . . . 999, i.e. each of which represents a time difference between a time tn when a first one of the pulses reaches a specific voltage and a time tn+1 when a second one of the pulses most adjacent to said first one pulse reaches the specific voltage VDD/2;

c) obtaining a plurality of absolute values Bn=abs(Dn+1−Dn), where n=1, 2, 3 . . . 998, of differences, i.e. each of which represents a difference between most adjacent two of time differences Dn; and d) obtaining a phase difference by dividing by 2 an average value of absolute values Bn, i.e. the phase difference=(B1+B2+B3 . . . +B998)/1996.

It is to be noticed that in addition to the phase difference, the output signal still exists a jitter value. From the statistical point of view, however, the jitter can be neglected if the number of the time points tn is enough. It thus can be known that time points tn should be as many as possible. In this embodiment, first signal x and second signal y are square waves. It can be seen that output signal Z includes a first portion and a second portion during which the first signal pulses and the second signal pulses respectively begin to rise until the first signal pulses and the second signal pulses respectively end to fall.

Figure 7:
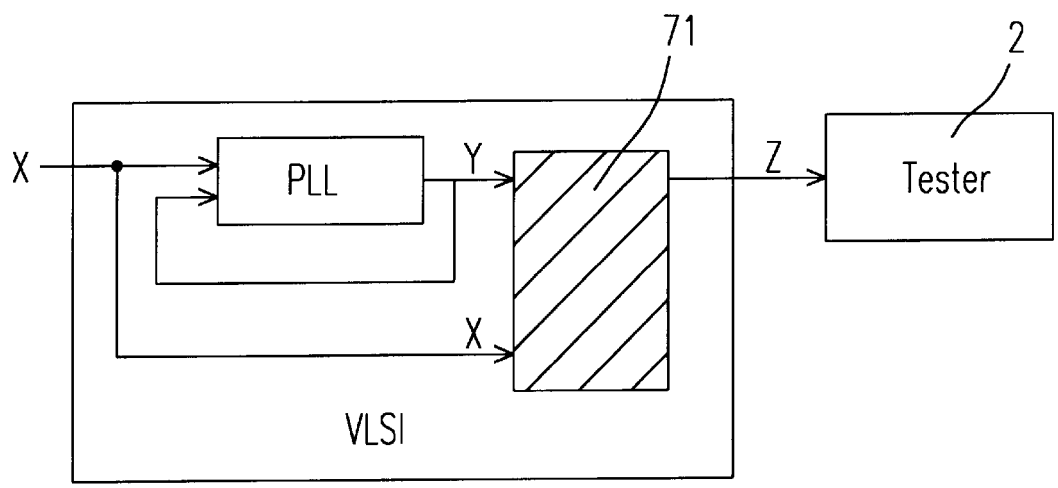
FIG. 7 is a block diagram showing an application of a signal-testing device according to the present invention.

As shown in FIG. 7, a signal-testing intermediate 71 according to the present invention can be connected a PLL to be applied in an IC to measure the phase difference between signals x and y which reach tester 2 through the same path so that the testing error originating from different paths is greatly reduced.

Figure 8:
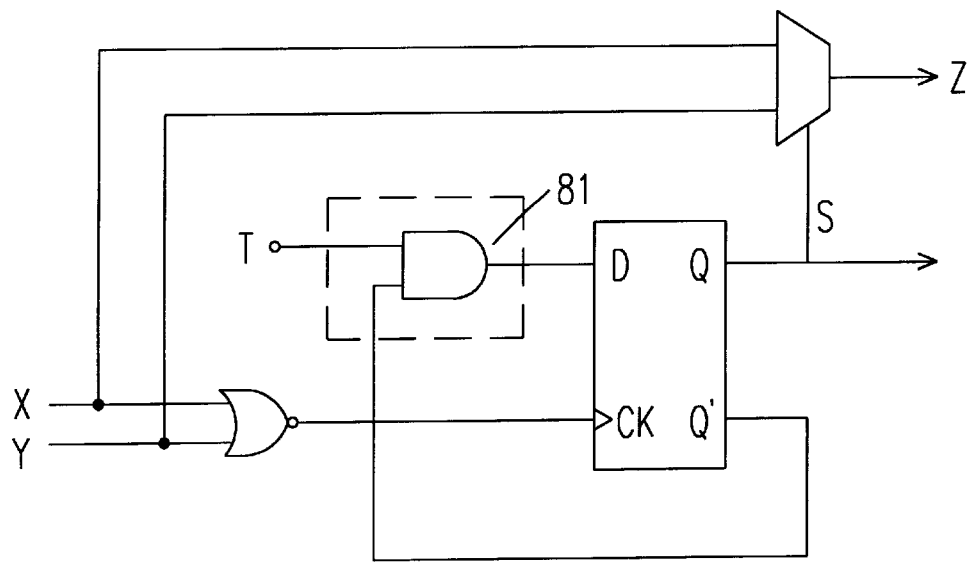
FIG. 8 is a diagram showing a signal-testing device according to a further preferred embodiment of the present invention.

In order to be additionally able to measure the jitter of output signal Z, the present selected signal generator further includes a second logic gate 81, being an AND gate in this embodiment, electrically connected to the flip-flop as shown in FIG. 8 and having a test mode control end T having an input voltage, in which the selected signal S outputted from the flip-flop is kept in a first state, e.g. "0", to enable the signal selector to selectively output the second signal for testing a jitter of the output signal Z when the input voltage is in a first state, e.g. "0", and the selected signal S outputted from the flip-flop changes in response to first and second signals x, y to enable the signal selector to respectively selectively output first and second signals x and y for obtaining a phase difference between first and second signals x and y when the input voltage is in a second state, e.g. "1".

It is to be noticed that the present signal-testing device is to be used with a tester 2, and it can be known that which one of signal x and signal y is to be outputted by multiplexer 521 can be determined by the output Q of D type flip-flop 512.

Figure 9:
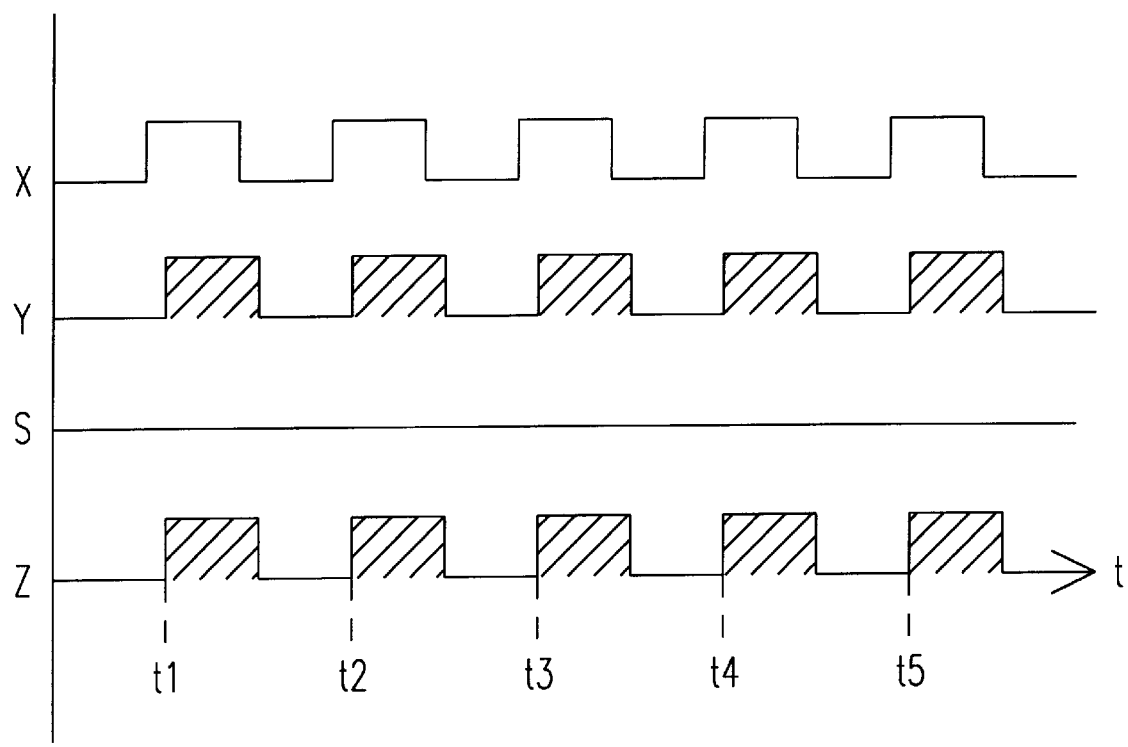
FIG. 9 is a diagram showing the time sequences for the signals in the circuit shown in FIG. 8 according to the present invention.

As complementarily shown in FIG. 9, when control end T=0, selected signal S will be kept at "0" so that the output signal Z will be the same as second signal y and can be used to test the jitter through the following steps of:

a) generating an output signal Z having a plurality of pulses, setting the trigger voltage for the tester 2 to be VDD/2, and setting time points tn, in which n=1, 2, 3 . . . 1,000, where the pulses respectively reach VDD/2;

b) obtaining a plurality of time differences Dn=tn+1−tn, in which n=1, 2, 3 . . . 999, each of which represents a time difference between a time tn when a first one of the pulses reaches VDD/2 and a time tn+1 when a second one of the pulses most adjacent to the first one pulse reaches VDD/2;

c) obtaining an average value Tc of said time differences, i.e. Tc=(D1+D2+D3 . . . +D999)/999;

d) respectively calculating differential values Dn−Tc between average value Tc and time differences Dn;

e) respectively obtaining a plurality of extreme values MAXn or MINn among every respective differential value Dn−Tc and several, e.g. 2, succeeding differential values thereof, e.g. Dn+Dn+1−2Tc and Dn+Dn+1+Dn+2−3Tc, in which n=1, 2, 3 . . . 997; and f) obtaining an extreme (maximum or minimum) among extreme values MAXn or MINn.

Through the above steps, we obtain jitter={min[MINn], max[MAXn]}. In practical circuit design, in addition to realize the jitter of each pulse, we normally want to know the jitter resulting from a plurality of pulses in a pipeline structure so that how many differential values are to be used varies as the requirements and specific specifications vary.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What we claim is:

1. A signal-testing device adapted to be electrically connected to a tester for testing a first signal having a first state and a second state and a second signal having a third state and a fourth state comprising:

a selected signal generator receiving said first signal and said second signal for generating a selected signal having a state which is changed when said first signal is in said first state and said second signal is in said third state; and a signal selector electrically connected to said selected signal generator for selectively outputting one of said first and second signals in response to said selected signal state.

2. A signal-testing device according to claim 1 wherein said first and said third states are the same, and said second and said fourth states are the same.

3. A signal-testing device according to claim 1 wherein said selected signal generator includes:

a first logic gate for outputting a clock signal having a state which is changed when said first signal is in said first state and said second signal is in said third state; and a flip-flop electrically connected to said first logic gate for outputting said selected signal where said selected signal state is changed in response to said clock signal state.

4. A signal-testing device according to claim 3 wherein said first logic gate is a NOR gate.

5. A signal-testing device according to claim 3 wherein said clock signal state is one selected from a group consisting of a low voltage state, a high voltage state, a state changing from said low voltage state into said high voltage state, and a state changing from said high voltage state into said low voltage state.

6. A signal-testing device according to claim 5 wherein said flip-flop changes said selected signal state when said clock signal is in said state changing from said low voltage state into said high voltage state.

7. A signal-testing device according to claim 6 wherein said flip-flop is a D-type flip-flop.

8. A signal-testing device according to claim 3 wherein said selected signal state is one of a low voltage state and a high voltage state.

9. A signal-testing device according to claim 8 wherein said signal selector respectively selects said first and said second signals when said selected signal is respectively in said low voltage and said high voltage states.

10. A signal-testing device according to claim 9 wherein said signal selector is a multiplexer.

11. A signal-testing device according to claim 3 wherein said selected signal generator further includes a second logic gate electrically connected to said flip-flop and having a test mode control end having an input voltage, in which said selected signal outputted from said flip-flop is kept in a first state to enable said signal selector to selectively output said second signal for testing a jitter of said output signal when said input voltage is in a first state, and said selected signal outputted from said flip-flop changes in response to said first and said second signals to enable said signal selector to respectively selectively output said first and said second signals for obtaining a phase difference between said first and said second signals when said input voltage is in a second state.

12. A signal-testing device according to claim 11 wherein said second logic gate is an AND gate.

13. A signal-testing device according to claim 11 wherein said first and said second states of said input voltage are respectively in a low voltage and a high voltage.

14. A signal-testing method comprising the following steps of:
   a) generating an output signal having a plurality of pulses in response to a first signal and a second signal;
   b) obtaining a plurality of time differences each of which represents a time difference between a time when a first one of said pulses reaches a specific voltage and a time when a second one of said pulses most adjacent to said first one pulse reaches said specific voltage;
   c) obtaining a plurality of absolute values of differences each of which represents a difference between most adjacent two of said plurality of time differences; and
   d) obtaining a phase difference by dividing by 2 an average value of said absolute values.

15. A signal-testing method according to claim 15 wherein said first signal and said second signal are square waves and respectively have a plurality of pulses.

16. A signal-testing method according to claim 15 wherein said output signal includes a first portion and a second portion during which said first signal pulses and said second signal pulses respectively begin to rise until said first signal pulses and said second signal pulses respectively end to fall.

17. A signal-testing method according to claim 14 wherein said time differences have a number of 1,000.

18. A signal-testing method according to claim 14 wherein said specific voltage is one half of a voltage of said selected signal pulse.

19. A signal-testing method comprising the following steps of:
   a) generating a signal having a plurality of pulses;
   b) obtaining a plurality of time differences each of which represents a time difference between a time when a first one of said pulses reaches a specific voltage and a time when a second one of said pulses most adjacent to said first one pulse reaches said specific voltage;
   c) obtaining an average value of said time differences;
   d) respectively calculating differential values between said average value and said time differences; and
   e) obtaining extreme values among said differential values.

20. A signal-testing method according to claim 19 wherein said extreme values are extreme jitters of said signal.

21. A signal-testing method according to claim 19 wherein said extreme values are maximum values.

22. A signal-testing method according to claim 19 wherein said extreme values are minimum values.

* * * * *